United States Patent
Ominami et al.

(10) Patent No.: US 8,921,786 B2
(45) Date of Patent: *Dec. 30, 2014

(54) CHARGED PARTICLE BEAM APPARATUS

(71) Applicant: Hitachi High-Technologies Corporation, Minato-ku, Tokyo (JP)

(72) Inventors: Yusuke Ominami, Tokyo (JP); Sukehiro Ito, Tokyo (JP); Tomohisa Ohtaki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/191,769

(22) Filed: Feb. 27, 2014

(65) Prior Publication Data

US 2014/0175278 A1 Jun. 26, 2014

Related U.S. Application Data

(63) Continuation of application No. 14/111,174, filed as application No. PCT/JP2012/001431 on Mar. 2, 2012, now Pat. No. 8,710,439.

(30) Foreign Application Priority Data

Apr. 11, 2011 (JP) ................................. 2011-086904

(51) Int. Cl.

| | |
|---|---|
| *H01J 37/28* | (2006.01) |
| *H01J 37/20* | (2006.01) |
| *G01N 13/10* | (2006.01) |
| *H01J 37/18* | (2006.01) |
| *H01J 37/16* | (2006.01) |
| *H01J 37/244* | (2006.01) |

(52) U.S. Cl.
CPC ............. *H01J 37/185* (2013.01); *H01J 37/18* (2013.01); *H01J 37/20* (2013.01); *H01J 37/28* (2013.01); *H01J 37/16* (2013.01); *H01J 37/244* (2013.01); *H01J 2237/16* (2013.01); *H01J 2237/164* (2013.01); *H01J 2237/2608* (2013.01)
USPC ........... 250/311; 250/306; 250/310; 250/397; 250/441.11; 250/492.2

(58) Field of Classification Search
CPC ................. H01J 37/28; H01J 2237/082; H01J 2237/1825; H01J 2237/162; H01J 2237/188
USPC .......... 250/311, 310, 306, 397, 441.11, 492.2
See application file for complete search history.

(56) References Cited

U.S. PATENT DOCUMENTS 6,855,929 B2 2/2005 Kimba et al.
7,241,993 B2 * 7/2007 Nakasuji et al. .............. 250/310

(Continued)

FOREIGN PATENT DOCUMENTS

JP 2004-158364 A 6/2004
JP 2005-175042 A 6/2005

(Continued)

*Primary Examiner* — Nikita Wells
(74) *Attorney, Agent, or Firm* — Miles & Stockbridge P.C.

(57) ABSTRACT

Provided is a charged particle beam apparatus or charged particle microscope capable of observing an observation target sample in an air atmosphere or a gas environment without making significant changes to the configuration of a conventional high vacuum charged particle microscope. In a charged particle beam apparatus configured such that a thin film (10) is used to separate a vacuum environment and an air atmosphere (or a gas environment), an attachment (121) capable of holding the thin film (10) and whose interior can be maintained at an air atmosphere or a gas environment is inserted into a vacuum chamber (7) of a high vacuum charged particle microscope. The attachment (121) is vacuum-sealed and fixed to a vacuum partition of the vacuum sample chamber. Image quality is further improved by replacing the atmosphere in the attachment with helium or a light-elemental gas that has a lower mass than atmospheric gases such as nitrogen or water vapor.

20 Claims, 11 Drawing Sheets

(56) References Cited

U.S. PATENT DOCUMENTS

| | | |
|---|---|---|
| 7,365,323 B2 | 4/2008 | Ohtaki et al. |
| 7,601,972 B2 * | 10/2009 | Nakasuji et al. ......... 250/441.11 |
| 7,671,333 B2 | 3/2010 | Agronskaja et al. |
| 8,710,439 B2 * | 4/2014 | Ominami et al. ............. 250/311 |
| 2004/0108459 A1 | 6/2004 | Furukawa et al. |
| 2006/0249677 A1 | 11/2006 | Chao et al. |
| 2008/0210869 A1 | 9/2008 | Gerritsen et al. |
| 2009/0166536 A1 | 7/2009 | Suga et al. |
| 2009/0242763 A1 | 10/2009 | Buijsse |
| 2010/0140470 A1 | 6/2010 | Shachal |
| 2011/0303845 A1 | 12/2011 | Yaguchi et al. |
| 2012/0126118 A1 | 5/2012 | Suzuki et al. |

FOREIGN PATENT DOCUMENTS

| | | |
|---|---|---|
| JP | 2006-179751 A | 7/2006 |
| JP | 2006-318903 A | 11/2006 |
| JP | 2008-192616 A | 8/2008 |
| JP | 2009-158222 A | 7/2009 |
| JP | 2009-245944 A | 10/2009 |
| JP | 2010-509709 A | 3/2010 |
| JP | 2011-014414 A | 1/2011 |
| WO | WO 2010/092747 A1 | 8/2010 |
| WO | WO 2011/001586 A1 | 1/2011 |

* cited by examiner

CHARGED PARTICLE BEAM APPARATUS

TECHNICAL FIELD

The present invention relates to a microscope technology with which an observation target sample can be observed at atmospheric pressure or in a predetermined gas environment, in particular, a tabletop charged particle microscope.

BACKGROUND ART

For observing a minute area of an object, a scanning electron microscope (SEM), a transmission electron microscope (TEM), and the like are used. When such apparatuses are used, a sample is typically imaged after a second housing for housing the sample is evacuated to a vacuum and the sample atmosphere is set to a vacuum state. Meanwhile, there has been an increasing need for observing a sample that may become damaged or change state due to a vacuum, such as a biochemical sample or a liquid sample, using an electron microscope. Thus, in recent years, SEM apparatuses, sample holding apparatuses, and the like that can observe observation target samples under atmospheric pressure have been developed.

Such apparatuses are adapted to have a vacuum state and an atmospheric state that are separated by providing a thin film or a minute through-hole between electron optics and a sample, in principle, and thus are common in that a thin film is provided between the sample and the electron optics.

For example, Patent Literature 1 discloses an atmospheric-pressure SEM in which an electron source side of an electron optical column is arranged such that it faces downward, and an objective lens side is arranged such that it faces upward, and further, a thin film that allows an electron beam to pass therethrough is provided on an electron beam emission hole at an end of the electron optical column, with an O-ring interposed therebetween. In the invention described in Patent Literature 1, SEM observation is conducted in such a manner that an observation target sample is mounted directly on the thin film, and the sample is irradiated with a primary electron beam from the side of the bottom face of the sample, and then, reflected electrons or secondary electrons are detected. The sample is held in a space that is formed by the thin film and an annular member disposed around the thin film. Further, the space is filled with a liquid such as water. The invention disclosed in Patent Literature 1 implements an atmospheric-pressure SEM that is suitable for observing a biological sample, in particular.

Patent Literature 2 discloses an invention of an environmental cell in which an observation target sample is stored in a plate-like cylindrical container, on the upper face of which is provided an aperture for allowing an electron beam to pass therethrough, and the cylindrical container is provided in a vacuum sample chamber of a SEM, and further, a hose is connected to the cylindrical container from outside of the vacuum sample chamber, whereby the interior of the container can be maintained at an air atmosphere in a pseudo manner. The term "pseudo" herein means that as a gas flows out of the aperture when the vacuum sample chamber is evacuated to a vacuum, observation is not conducted under an atmospheric-pressure environment in the strict sense.

CITATION LIST

Patent Literature

Patent Literature 1: JP 2009-158222 A (USP 2009/0166536 A)

Patent Literature 2: JP 2009-245944 A (USP 2009/0242763 A)

SUMMARY OF INVENTION

Technical Problem

The conventional charged particle microscope or charged particle beam apparatus having a function of conducting observation in a gas environment is an apparatus that is specifically produced for conducting observation under a gas environment, and there have been no apparatuses that can easily conduct observation under an atmospheric-pressure/gas environment using an ordinary high vacuum charged particle microscope.

For example, the atmospheric-pressure SEM described in Patent Literature 1 is a structurally very special device, and cannot execute SEM observation in an ordinary high vacuum environment. In addition, as a target to be observed is held within a thin film that is filled with a liquid, the sample may become wet if observation at atmospheric pressure is executed once. Thus, it would be very difficult to observe a sample in the same state in each of the air environment and the high vacuum environment. Further, as the thin film is always in contact with the liquid, there is a problem in that the thin film may become damaged with quite a high possibility.

The environmental cell described in Patent Literature 2 can conduct observation in an atmospheric-pressure/gas environment. However, there is a problem in that as it is only possible to conduct observation of a sample with a size that can be inserted into the cell, it would be impossible to conduct observation of a large sample at atmospheric pressure/gas environment. In addition, when such an environmental cell is used, in order to observe a different sample, it would be necessary to take the environmental cell out of the vacuum sample chamber of the SEM to replace the sample, and carry the environmental cell into the vacuum sample chamber again, which is problematic in that the replacement of the sample is complex.

The present invention has been made in view of the foregoing problems, and it is an object of the present invention to provide a charged particle beam apparatus or charged particle microscope with which an observation target sample can be observed in an atmospheric environment or a gas environment without significantly changing the configuration of the conventional high vacuum charged particle microscope.

Solution to Problem

The present invention solves the aforementioned problems by fixing to a vacuum chamber of a charged particle microscope an attachment, which can have the sample stored therein with pressure in the attachment being maintained higher than pressure in the vacuum chamber, by inserting the attachment into the vacuum chamber through an opening of the vacuum chamber. The opening of the vacuum chamber is provided in, for example, a side face or a bottom face of the vacuum chamber. In addition, the attachment has a function of holding a thin film that allows a primary charged particle beam to penetrate or pass through the interior of the attachment, thereby ensuring a pressure difference between the interior of the vacuum chamber and that of the attachment. The vacuum chamber may also be referred to as a first housing, while the attachment may also be referred to as a second housing for the vacuum chamber.

Advantageous Effects of Invention

While the vacuum chamber is maintained at a high degree of vacuum by the thin film, the interior of the attachment is maintained at atmospheric pressure/gas environment. In addition, an observation target sample can be carried into or out of the attachment. That is, the present invention can implement a charged particle microscope that can more easily conduct observation at atmospheric pressure/gas environment than is conventionally done.

The size of the attachment of the present invention can be easily increased as it adopts a method of insertion from a side face of the sample chamber. Thus, it is possible to observe even a large sample that would not be able to be encapsulated in the environmental cell.

DESCRIPTION OF EMBODIMENTS

Hereinafter, embodiments will be described with reference to the drawings.

Embodiment 1

Figure 1:
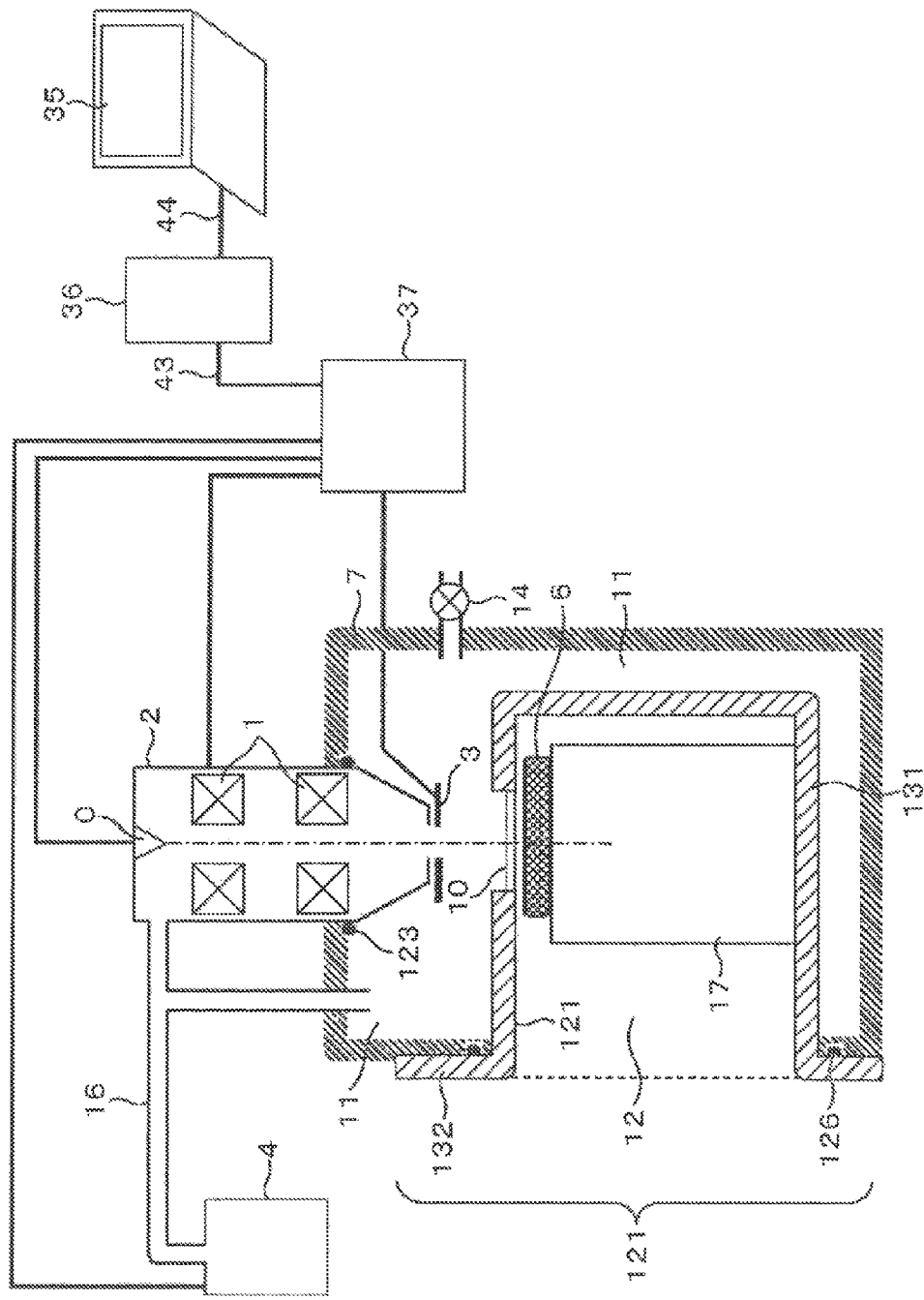
FIG. 1 is an overall configuration view of a charged particle microscope in Embodiment 1.

This embodiment will describe the most basic embodiment. FIG. 1 is an overall configuration view of a charged particle microscope in this embodiment. The charged particle microscope shown in FIG. 1 mainly includes a charged particle optical column 2, a first housing (i.e., a vacuum chamber) 7 that supports the charged particle optical column with respect to an apparatus installation plane, a second housing (i.e., an attachment) 121 that is used through insertion into the first housing 7, and a controller therefor. When the charged particle microscope is used, the interior of the charged particle optical column 2 and the first housing are evacuated to a vacuum by a vacuum pump 4. Actuation and stop operation of the vacuum pump 4 are also controlled by the controller. Although FIG. 1 shows a single vacuum pump 4, two or more vacuum pumps 4 may be provided.

The charged particle optical column 2 includes elements such as a charged particle source 0 that generates a charged particle beam, and optical lenses 1 that converge and guide the generated charged particle beam toward the bottom of the column to thereby cause it to scan a sample 6, as a primary charged particle beam. The charged particle optical column 2 is disposed such that it protrudes toward the interior of the first housing 7, and is fixed to the first housing 7 with a vacuum sealing member 123 interposed therebetween. A detector 3, which detects secondary charged particles (i.e., secondary electrons or reflected electrons) obtained upon irradiation with the primary charged particle beam, is disposed at an end of the charged particle optical column 2. In the exemplary configuration shown in FIG. 1, the detector 3 is provided in the first housing 7, but it may be disposed in the charged particle optical column 2 or in the second housing 121.

The charged particle microscope in this embodiment includes, as the controller, a personal computer 35 that a user of the apparatus uses, an upper-level controller 36 that is connected to and communicates with the personal computer 35, and a lower-level controller 37 that controls a vacuum evacuation unit, a charged particle optical unit, and the like in response to instructions transmitted from the upper-level controller 36. The personal computer 35 includes a monitor that displays an operation screen (GUI) of the apparatus, and an input means for the operation screen, such as a keyboard and a mouse. The upper-level controller 36 and the lower-level controller 37 are connected with a communication line 43, while the upper-level controller 36 and the personal computer 35 are connected with a communication line 44.

The lower-level controller 37 is a portion that transmits and receives control signals for controlling the vacuum pumps 4, a gas control valve 101, the charged particle source 0, the optical lenses 1, and the like, and further converts an output signal of the detector 3 into a digital image signal for transmission to the upper-level controller 36. Although the output signal of the detector 3 is connected to the lower-level controller 37 in FIG. 1, an amplifier such as a pre-amplifier may also be interposed therebetween.

The upper-level controller 36 and the lower-level controller 37 may include a mixture of analog circuits and digital circuits. In addition, the upper-level controller 36 and the lower-level controller 37 may be a single, integrated unit. Further, the configuration of the controller shown in FIG. 1 is only exemplary, and variations of the control units, the valve, the vacuum pump, the wires for communication, and the like all fall into the category of the SEM or the charged particle beam apparatus of this embodiment as far as the functions intended by this embodiment are satisfied.

A vacuum pipe 16 connected at one end to the vacuum pump 4 is connected to the first housing 7. Thus, the interior of the first housing 7 can be maintained in a vacuum state. At the same time, the first housing 7 has a leak valve 14 for exposing the interior of the housing to the atmosphere, and thus can expose the interior of the first housing 7 to the atmosphere in maintenance. The leak valve 14 may be either provided or not, and two or more leak valves 14 may also be provided. Further, the arrangement position of the leak valve 14 on the first housing 7 is not limited to the position shown in FIG. 1, and the leak valve 14 may be provided at another position on the first housing 7. Further, the first housing 7 has an opening at a side face thereof, and the second housing 121 is inserted thereinto through the opening.

The second housing 121 includes a main body portion 131, which is cuboid in shape, and a mating portion 132. The main body portion 131 has a function of storing the sample 6, which is a target to be observed, and is inserted into the first housing 7 through the opening. The mating portion 132 forms a mating face with an outer wall face of the first housing 7 on the side face side having the opening, and is fixed to the outer wall face on the side face side, with a vacuum sealing member 126 interposed therebetween. Accordingly, the second housing 121 is entirely fitted into the first housing 7. The opening can be most simply produced by using an opening that the vacuum sample chamber of the charged particle microscope originally has for carrying in or out the sample. That is, if the second housing 121 is produced in keeping with the size of the hole that is originally provided, and the vacuum sealing member 126 is attached to an area around the hole, alterations that should be made to the apparatus can be suppressed to the minimum.

The main body portion 131 has on the upper face side thereof a thin film 10 at a position where the thin film 10 is located immediately below the charged particle optical column 2 when the second housing 121 is entirely fitted into the first housing 7. Such a thin film 10 allows a primary charged particle beam emitted from the bottom end of the charged particle optical column 2 to penetrate or pass therethrough, so that the primary charged particle beam finally reaches the sample 6 through the thin film 10.

When the charged particle beam is an electron beam, the thin film 10 should have about a thickness that allows the electron beam to penetrate therethrough, typically, about 20 μm or less. Instead of the thin film, it is also possible to use an aperture member with a through-hole that allows a primary charged particle beam to pass therethrough. The hole diameter in that case is desirably less than or equal to an area of about 1 mm$^2$ from a request that differential pumping be able to be conducted using realistic vacuum pumps. When the charged particle beam is an ion beam, it is difficult for the ion beam to pass through the thin film without damaging the thin film. Thus, an aperture with an area that is less than or equal to about 1 mm$^2$ is used. A chain line in FIG. 1 indicates the optical axis of a primary charged particle beam. The charged particle optical column 2, the first housing 7, and the thin film 10 are arranged along the same axis as the optical axis of the primary charged particle beam. The distance between the sample 6 and the thin film 10 is adjusted by providing a sample table 17 with an appropriate height.

As shown in FIG. 1, a side face of the second housing 121 is an open face, and the sample 6 that is stored in the second housing 121 (i.e., on the right side of the dotted line in FIG. 1; hereinafter, a second space) is placed in an atmospheric pressure state during observation. Meanwhile, as the vacuum pump 4 is connected to the first housing 7, a closed space, which is formed by the inner wall face of the first housing 7, the outer wall face of the second housing, and the thin film 10 (hereinafter, a first space), can be evacuated to a vacuum. Accordingly, in this embodiment, while the apparatus is in operation, the charged particle optical column 2 and the detector 3 can be maintained in a vacuum state, while the sample 6 can be maintained at atmospheric pressure. In addition, as the second housing 121 has an open face, the sample 6 can be freely replaced during observation.

As described above, this embodiment can implement a charged particle microscope with which even a relatively large sample can be observed at atmospheric pressure.

Embodiment 2

This embodiment will describe an example of the application to a tabletop scanning electron microscope. Although an example of the application to a scanning electron microscope will be described, it is needless to mention that this embodiment can also be applied to a typical charged particle microscope such as an ion microscope.

Figure 2:
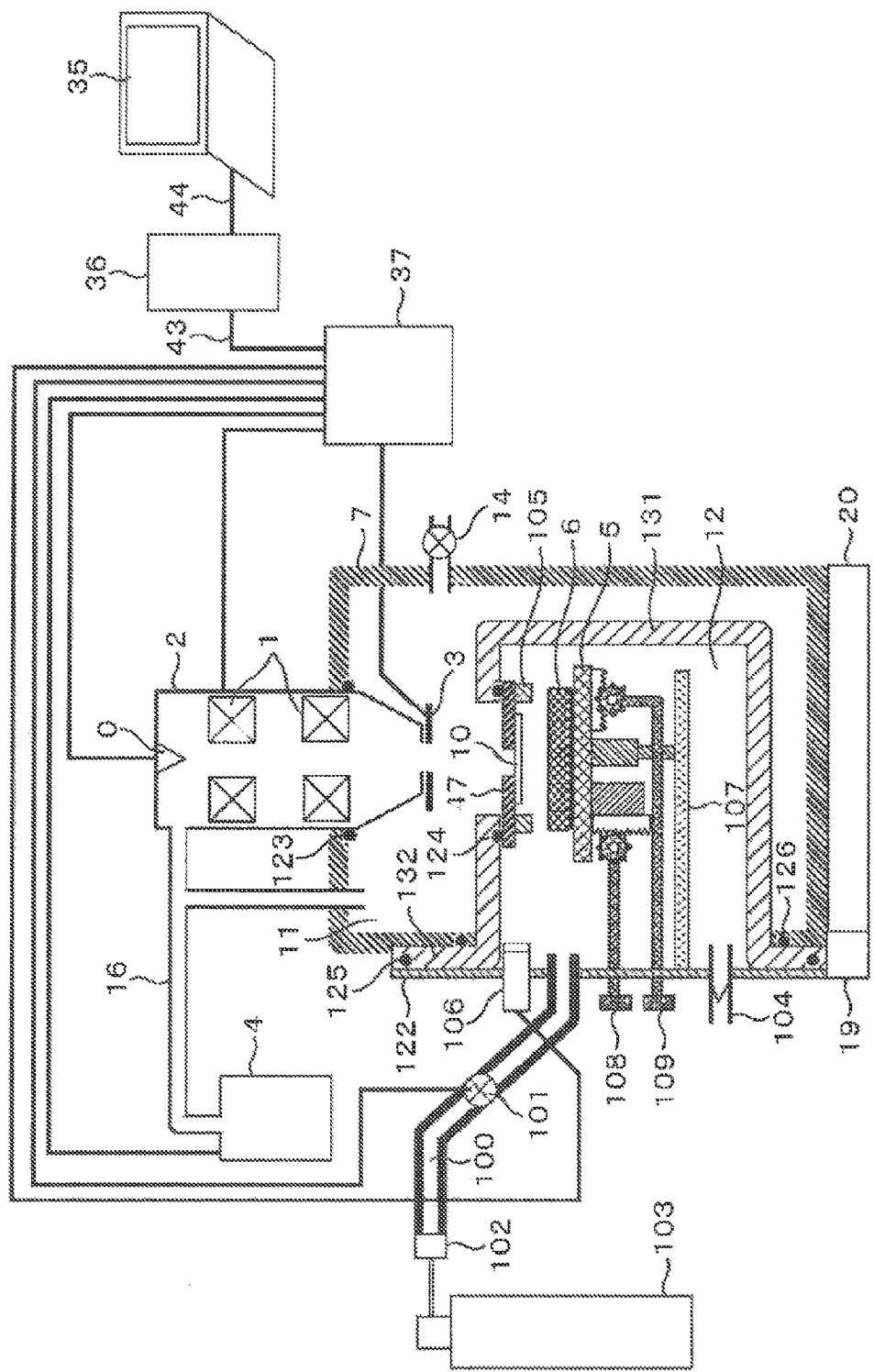
FIG. 2 is an overall configuration view of a charged particle microscope in Embodiment 2.

FIG. 2 shows an overall configuration view of a scanning electron microscope in this embodiment. As in Embodiment 1, the scanning electron microscope in this embodiment also includes an electron optical column 2, a first housing (i.e., a vacuum chamber) 7 that supports the electron optical column with respect to an apparatus installation plane, a second housing (i.e., an attachment) 121 that is used through insertion into the first housing 7, a controller therefor, and the like. The operation and function of each element, or additional elements that are added to each element are substantially the same as those in Embodiment 1. Thus, detailed description thereof will be omitted.

By the way, the thin film 10 of the scanning electron microscope in this embodiment is, unlike in Embodiment 1, removably fixed to the upper face of the main body portion 131 of the second housing with a thin film holding member 47 interposed therebetween. Although the thin film 10 is fixed to the thin film holding member 47 in a vacuum-sealing manner, it is also possible to use a vacuum sealing member such as an O-ring, or use an organic material such as adhesive, or a tape.

The thin film holding member 47 is removably fixed to the bottom face side of the ceiling board of the second housing 121 with a vacuum sealing member interposed therebetween. The thin film 10 is quite thin, as thin as about 20 μm from a request that the thin film 10 should allow an electron beam to penetrate therethrough. Thus, there is a possibility that the thin film 10 may deteriorate with time or be damaged while it is prepared for observation. Meanwhile, the thin film 10, which is thin, is quite difficult to handle directly. Thus, if the thin film 10 is able to be handled not directly but via the thin film holding member 47 as in this embodiment, handling (in particular, replacement) of the thin film 10 becomes quite easy. That is, if the thin film 10 is damaged, the whole thin film holding member 47 may be replaced. Even if it is necessary to directly replace the thin film 10, it is possible to take the thin film holding member 47 out of the apparatus and replace the thin film 10 outside the device. It is also possible to, as in Embodiment 1, use an aperture member with a hole with an area that is less than or equal to about 1 mm$^2$ instead of the thin film.

Further, the thin film holding member 47 in this embodiment has, on the side that is opposite the sample 6, a restriction member 105 that avoids contact between the thin film and the sample. For the restriction member 105, anything that can restrict the distance between the sample and the thin film may be used. Most simply, an adhesive or a tape may be attached for use as the restriction member 105. However, when the mean free path of a primary electron beam that has passed through the thin film 10 is considered, the restriction member 105 is preferably produced using a thin film material whose thickness is precisely known. Although the restriction member 105 is attached to the thin film holding member 47 in FIG. 2, it may also be attached to the thin film 10 or a sample stage 5, or be mounted on the sample 6. Further, the restriction member 105 may be provided in a removable fashion.

In the case of the scanning electron microscope in this embodiment, the open face of the second housing 121 is configured to be able to be covered with a covering member 122. Thus, various functions can be realized. Hereinafter, such functions will be described.

The scanning electron microscope in this embodiment has a function of supplying a replacement gas into the second housing. An electron beam emitted from the bottom end of the electron optical column 2 passes through the first space that is maintained at a high degree of vacuum, and passes through the thin film 10 (or an aperture member) shown in FIG. 2, and further enters the second space that is maintained at atmospheric pressure or a lower degree of vacuum (than is the first space). However, as an electron beam will be scattered by gas molecules in the space where the degree of vacuum is low, the mean free path will be shorter correspondingly. That is, when the distance between the thin film 10 and the sample 6 is long, it would be impossible for an electron beam or secondary electrons or reflected electrons, which are generated by the electron beam irradiation, to reach the sample. Meanwhile, the probability of the scattering of an electron beam is proportional to the mass number of gas molecules. Thus, if the atmosphere in the second space is replaced with gas molecules whose mass number is lower than that of the atmosphere, the probability of the scattering of the electron beam will decrease, which will allow the electron beam to reach the sample. As the type of the replacement gas, if a gas that is lighter than the atmosphere, such as nitrogen or water vapor is used, the effect of improvement in the image S/N is seen, while when a helium gas or a hydrogen gas whose mass number is lower is used, the effect of improvement in the image S/N becomes higher.

From the foregoing reasons, in the scanning electron microscope in this embodiment, the covering member 122 is provided with an attachment portion (i.e., a gas introducing portion) of a gas supply pipe 100. The gas supply pipe 100 is connected to a gas cylinder 103 with a connecting portion 102. Accordingly, a replacement gas is introduced into the second space 12. A gas control valve 101 is disposed in the gas supply pipe 100, so that the flow rate of a replacement gas that flows through the pipe can be controlled. Therefore, a signal line extends from the gas control valve 101 to the lower-level controller 37, so that a user of the apparatus is able to control the flow rate of the replacement gas on the operation screen that is displayed on the monitor of the personal computer 35.

The replacement gas, which is a light-element gas, will easily accumulate in the upper portion of the second space 12, and thus, gas in the lower side of the second space 12 is difficult to replace. Thus, an opening is provided in the covering member 122 at a position (i.e., at the attachment position of the pressure control valve 104 in FIG. 2) lower than the attachment position of the gas supply pipe 100. Accordingly, as the atmospheric gas is pushed away by the light-element gas introduced from the gas introducing portion and is evacuated from the opening on the lower side, the atmosphere in the second housing 121 can be efficiently replaced. It should be noted that such an opening may combine the function of a rough evacuation port described below.

The second housing 121 or the covering member 122 may be provided with a vacuum evacuation port so that the second housing 121 is evacuated to a vacuum once before a replacement gas is introduced into the second housing 121. The vacuum evacuation in this case has only to be performed by reducing the atmospheric gas components remaining in the second housing 121 to less than or equal to a given amount. Thus, high vacuum evacuation need not be performed, and rough evacuation would be enough. However, in the case that a sample containing moisture, such as a biological sample, is observed, if the sample is placed in a vacuum state once, the moisture will evaporate and the sample will change state. Thus, as described above, a method of directly introducing a replacement gas from the air atmosphere is preferable. After the replacement gas is introduced, the aforementioned opening is closed with a covering member, whereby the replacement gas can be effectively confined in the second space 12.

If a three-way valve is attached at a position of the opening, such an opening can combine the functions of a rough evacuation port and an air leak evacuation port. That is, if one port of the three-way valve is attached to the covering member 122, another port is connected to a rough evacuation vacuum pump, and a leak valve is attached to the other port, an evacuation port that combines the aforementioned functions can be realized.

It is also possible to provide a pressure control valve 104 instead of the aforementioned opening. The pressure control valve 104 has a function of automatically opening the valve when the pressure in the second housing 121 becomes 1 atmospheric pressure or greater. If a pressure control valve with such a function is provided, when the inner pressure becomes 1 atmospheric pressure or greater upon introduction of a light-element gas, the valve automatically opens to discharge the atmospheric gas components such as nitrogen and oxygen to the outside of the apparatus, so that the interior of the apparatus can be filled with the light-element gas. It should be noted that the gas cylinder 103 shown in the drawing may be either provided in the scanning electron microscope in advance or be attached by the user of the apparatus later.

Next, a method of adjusting the position of the sample 6 will be described. The scanning electron microscope in this embodiment has a sample stage 5 as a means for moving the observation visual field. The sample stage 5 has an XY driving mechanism for the plane direction and a Z-axis driving mechanism for the height direction. A support plate 107, which serves as a bottom plate for supporting the sample stage 5, is attached to the covering member 122, and the sample stage 5 is fixed to the support plate 107. The support plate 107 is attached to a face, which faces the second housing 121, of the covering member 122 such that it extends toward the interior of the second housing 121. The Z-axis driving mechanism and the XY driving mechanism have support axes that extend therefrom and connect to an operation knob 108 and an operation knob 109, respectively. The user of the apparatus adjusts the position of the sample 6 in the second housing 121 by operating such operation knobs 108 and 109.

When the sample position is adjusted, the sample position in the plane direction is typically determined first, and then, the sample position in the height direction is adjusted. However, in order to avoid damage to the thin film 10, the position of the sample 6 in the height direction should be adjusted so that it is not located too close to the thin film 10. Therefore, the scanning electron microscope in this embodiment has an observation means such as a camera 106. Accordingly, it is possible to remotely observe the distance between the thin film 10 and the sample 6 and a view in which the sample 6 is being moved in the height direction. Instead of the camera 106, an optical microscope with high imaging resolution may also be used. Further, though not shown, the distance between the sample and the thin film may be measured using reflection of electromagnetic waves such as infrared rays. The attachment position of the observation means is not particularly limited to that shown in FIG. 2, and may be any position at which the distance between the sample and the thin film can be clearly measured.

Figure 3:
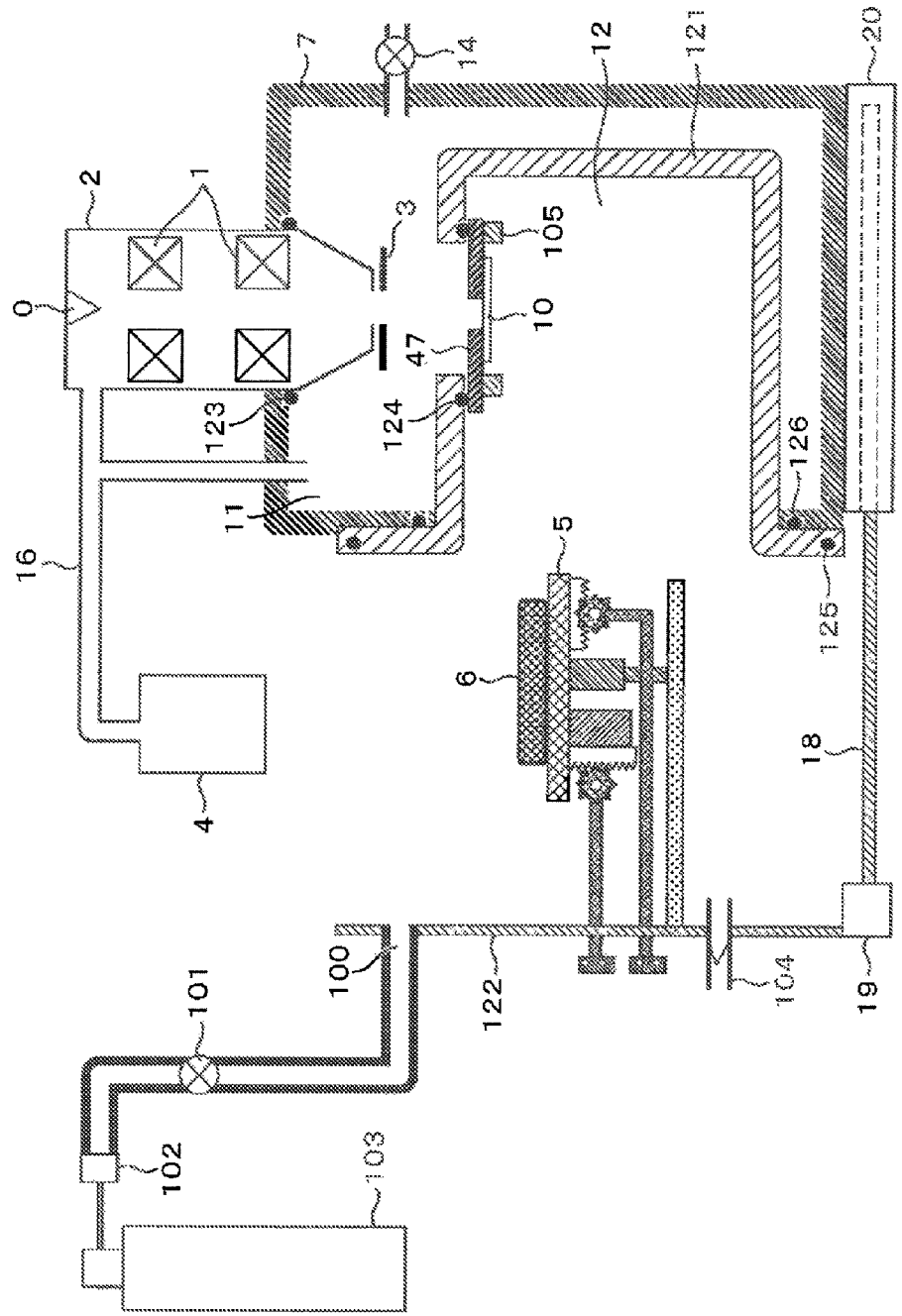
FIG. 3 is a view showing the charged particle microscope in Embodiment 2 in a state in which a plate member is pulled out.

Next, a replacement mechanism for the sample 6 will be described. The scanning electron microscope in this embodiment has a plate-member support member 19 and a bottom plate 20 that are provided on the bottom face of the first housing 7 and at the bottom end of the covering member 122. The covering member 122 is removably fixed to the second housing 121 with a vacuum sealing member 125 interposed therebetween. Meanwhile, the plate-member support member 19 is also removably fixed to the bottom plate 20. As shown in FIG. 3, the covering member 122 and the plate-member support member 19 are able to be entirely removed from the second housing 121.

The bottom plate 20 has a supporting rod 18 that is used as a guide in removal. In the ordinary state, the supporting rod 18 is stored in a storage unit that is provided in the bottom plate 20, and is configured to extend in the extraction direction of the covering member 122 in removal. At the same time, the supporting rod 18 is fixed to the plate-member support member 19, and is configured not to completely separate the covering member 122 from the main body of the scanning electron microscope when the covering member 122 is removed from the second housing 121. Accordingly, it is possible to avoid dropping of the sample stage 5 or the sample 6.

When the sample is carried into the second housing 121, the Z-axis operation knob of the sample stage 5 is first turned to move the sample 6 away from the thin film 10. Next, the pressure control valve 104 is opened to expose the interior of the second housing to the atmosphere. After that, it is checked that the interior of the second housing is not in the reduced-pressure state or an extremely pressurized state, and then the covering member 122 is pulled out to the opposite side of the main body of the apparatus. Accordingly, the sample 6 becomes replaceable. After the sample is replaced, the covering member 122 is pushed into the second housing 121, and the covering member 122 is fixed to the mating portion 132 with a fastening member (not shown), and then a replacement gas is introduced. The aforementioned operations can be executed with the operation of the electron optical column 2 being continued. Thus, the scanning electron microscope in this embodiment can promptly start observation after the replacement of the sample.

Figure 4:
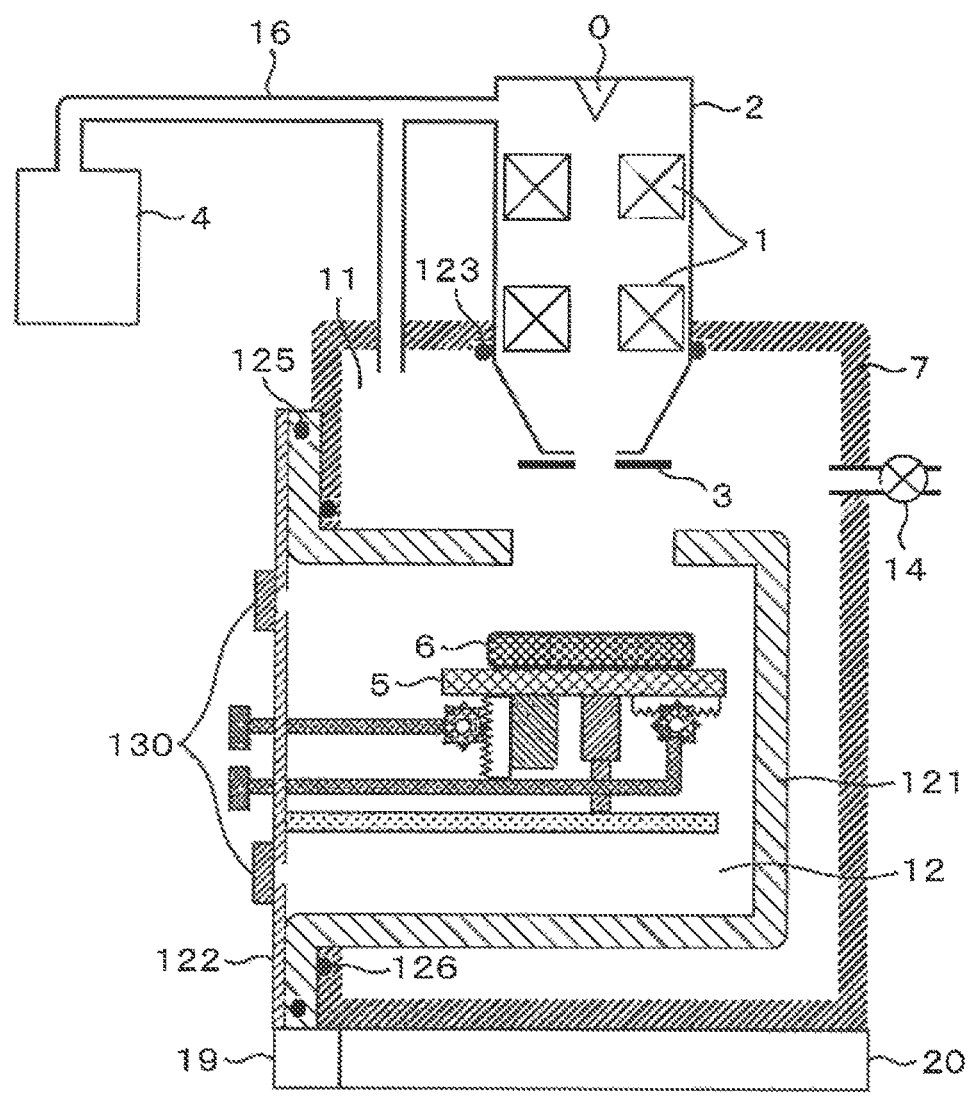
FIG. 4 is a view showing the charged particle microscope in Embodiment 2 in a state in which the microscope is used as a high vacuum SEM.

The scanning electron microscope in this embodiment can also be used as an ordinary high vacuum SEM. FIG. 4 shows an overall configuration view of the scanning electron microscope in this embodiment in a state in which the microscope is used as a high vacuum SEM. In FIG. 4, a controller is omitted as it is similar to that shown in FIG. 2. FIG. 4 shows a scanning electron microscope in a state in which the attachment positions of the gas supply pipe 100 and the pressure control valve 104 are clogged with covering members 130 after the gas supply pipe 100 and the pressure control valve 104 are removed from the covering member 122 in a state in which the covering member 122 is fixed to the second housing 121. If the thin film holding member 47 is removed from the second housing 121 through an operation before or after the aforementioned operation, it becomes possible to connect the first space 11 and the second space 12, and thus evacuate the interior of the second housing to a vacuum using the vacuum pump 4. Accordingly, high vacuum SEM observation can be conducted with the second housing 121 attached.

It should be noted that as a variation of the configuration in FIG. 4, it is also possible to remove the entire second housing 121 in a state in which the thin film holding member 47 is attached thereto, and directly fix the covering member 122 to the mating face of the first housing 7. With such a configuration, it is also possible to connect the first space 11 and the second space 12 and evacuate the interior of the second housing to a vacuum using the vacuum pump 4. This configuration is the same as the configuration of a typical SEM apparatus.

As described above, in this embodiment, all of the sample stage 5, its operation knobs 108 and 109, the gas supply pipe 100, and the pressure control valve 104 are integrally attached to the covering member 122. Thus, the user of the apparatus is able to conduct operations on the operation knobs 108 and 109, an operation of replacing a sample, or an operation of attaching or detaching the gas supply pipe 100 and the pressure control valve 104 on a single face of the first housing. Accordingly, the operability is quite improved in comparison with a scanning electron microscope with a configuration in which the aforementioned components are separately attached to different faces.

Figure 5:
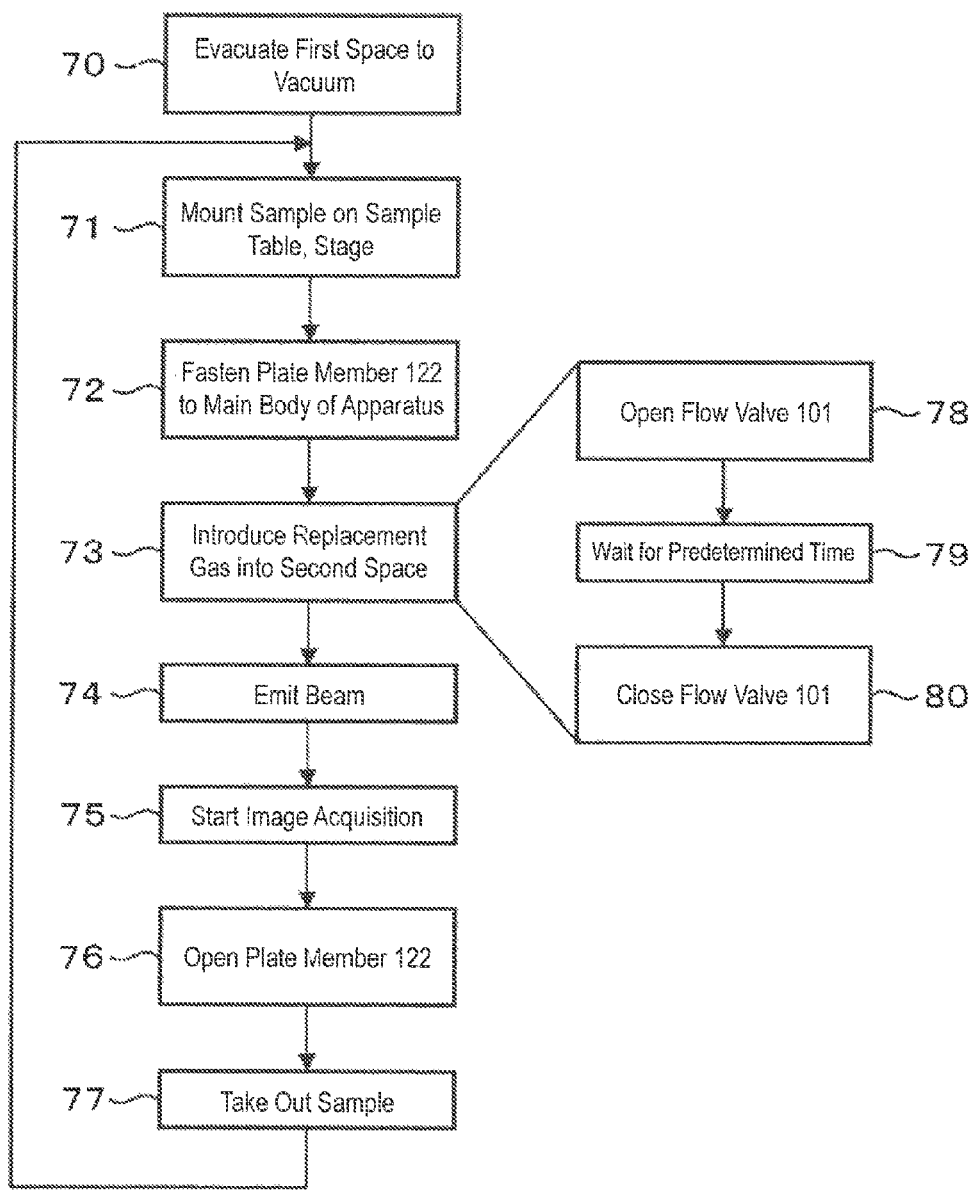
FIG. 5 is an operation illustration view of the charged particle microscope in Embodiment 2.

FIG. 5 shows a flowchart showing an operation flow of the scanning electron microscope in this embodiment.

In first step 70, the first space is evacuated to a vacuum. The first space may also be evacuated to a vacuum in advance. In second step 71, the sample 6 is mounted on a sample table on the sample stage 5, so as to be mounted on the sample stage 5. In third step 72, the covering member 122 is introduced into the second housing and is fastened to the main body of the apparatus (the second housing). In fourth step 73, the gas control valve 101 is opened for a given period of time and is then closed, so that a replacement gas such as a helium gas is introduced into the second space. In fifth step 74, the operation conditions of the electron optical column are adjusted to cause it to emit an electron beam. In sixth step 75, image acquisition is started. In seventh step 76, the covering member 122 is removed. The replacement gas confined in the second space is released to the outside of the apparatus. The covering member 122 may also be removed after the pressure control valve is opened and the replacement gas is discharged. In eighth step 77, the sample is taken out. If another sample is to be observed, the flow returns to second step 71.

It should be noted that the second space can not only be set to the atmospheric pressure state with a replacement gas being introduced thereinto, but also be set to a low vacuum state with a replacement gas being introduced thereinto in small quantities, or be set to a vacuum state. In this case, the flow control of the replacement gas or vacuum evacuation may be performed in fourth step 73. The flow in FIG. 5 shows only exemplary operations, and the order thereof may be changed as appropriate.

Figure 6:
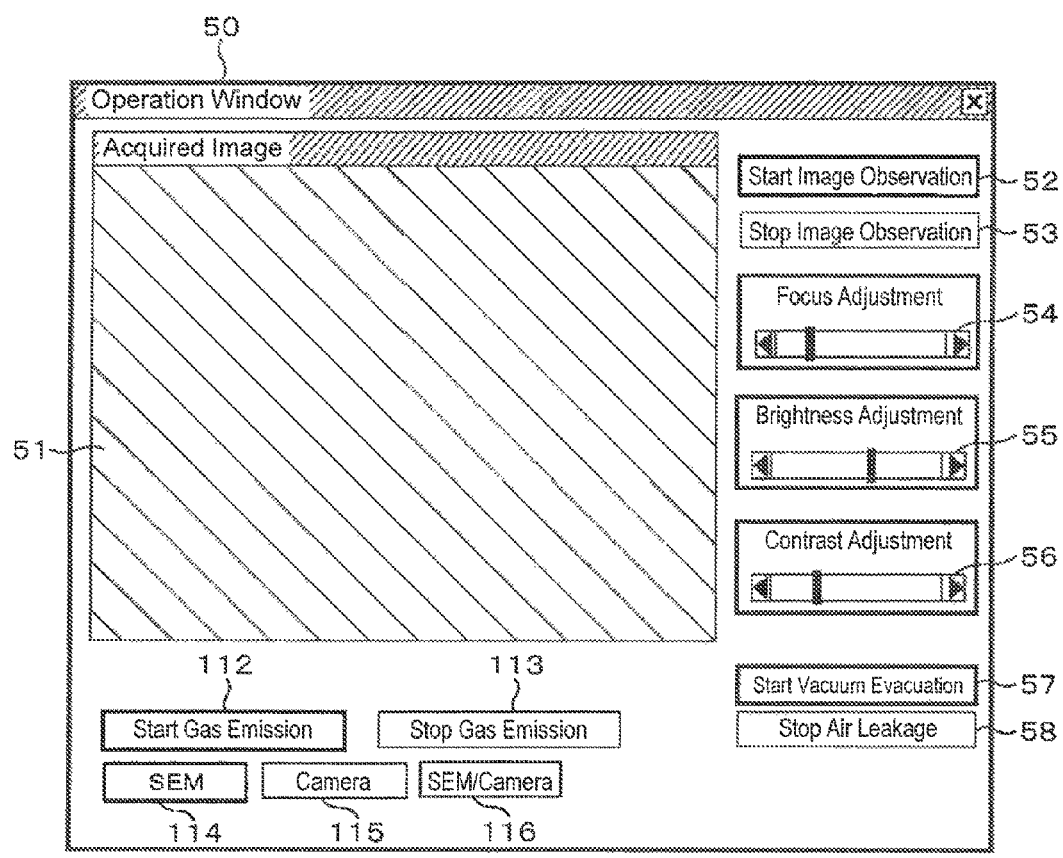
FIG. 6 shows an exemplary configuration of the charged particle microscope in Embodiment 2.

FIG. 6 shows an exemplary operation screen that is displayed on a monitor of the personal computer 35. The operation screen shown in FIG. 6 includes, for example, an operation window 50, an image display portion 51, an image observation start button 52 for starting electron beam emission to start display of an image, an image observation stop button 53 for stopping electron beam emission to stop display of an image, a focus adjustment button 54 for executing autofocus by adjusting optical lenses such as a deflection lens and an objective lens, a brightness adjustment button 55 for adjusting the brightness of the image, a contrast adjustment button 56 for adjusting the contrast, a vacuum evacuation button 57 for starting vacuum evacuation of the interior of the charged particle optical column 2 and the first housing 7, and an air leak button 58 for exposing the interior of the first housing 7 to the atmosphere. When the vacuum evacuation button 57 is clicked on the screen, vacuum evacuation starts, and when the button is clicked again, the vacuum evacuation stops. The operation of the air leak button 58 is similar. Processes that are executed through the aforementioned button operations can also be executed through manual operations, i.e., by operating the mechanical buttons or knobs provided on the main body of the apparatus.

The operation window 50 displays a gas emission start button 112 for opening the gas control valve 101 to emit gas through a gas nozzle, a gas emission stop button 113 for closing the gas control valve 101 to stop the gas emission, a SEM image display button 114 for displaying an image captured with the scanning electron microscope on the image display portion 51, and a camera button 115 for displaying an image acquired with the camera 106. When a SEM/Camera display button 116 is clicked, both a SEM image and a camera image can be displayed on the image display portion 51, which is particularly effective in adjusting the height of the sample 6.

In this embodiment, after the gas emission start button 112 is clicked and the gas control valve 101 opens, if one fails to click the gas emission stop button 113, there is a possibility that gas in the gas cylinder 103 may become insufficient.

Figure 7:
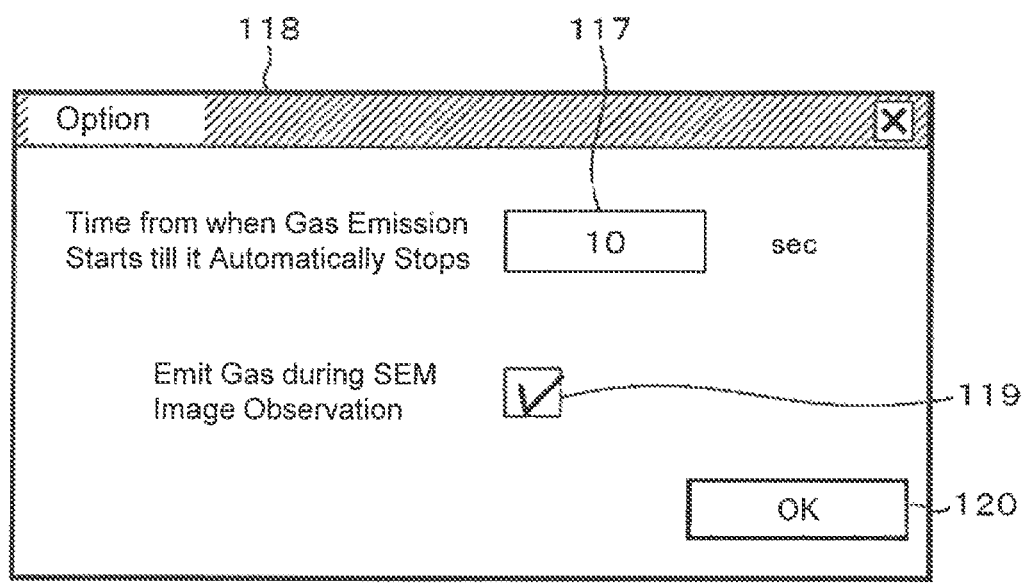
FIG. 7 shows an exemplary configuration of the charged particle microscope in Embodiment 2.

Therefore, as shown in FIG. 7, a child window 118 may be provided to display a gas emission time setting screen 117 for setting the duration of the gas emission from when the gas emission starts till it stops. The time from when the gas emission starts till it stops may not be set by the user of the apparatus, but a time that is preset on the apparatus may also be used.

There may be cases where the user wants to conduct gas emission only when observing a SEM image. In that case, another window 118 shown in FIG. 7 is displayed, and a check box 119 is checked in advance. When the image observation start button 52 is clicked with the check box being checked, the gas control valve 101 automatically opens, and a replacement gas starts to be introduced. After that, when the time set on the gas emission time setting screen 117 has elapsed, the gas control valve 101 automatically closes. When the image observation stop button 53 is clicked while the replacement gas is being introduced, the gas control valve 101 also closes automatically. It should be noted that when the SEM image display button 114, the camera button 115, or the SEM/Camera display button 116 is clicked while the replacement gas is being introduced, the image displayed on the image display portion 51 can be switched in accordance with the type of the selected image. Opening/closing control of the gas control valve 101 described above is executed by the lower-level controller 37 on the basis of the setting information in the personal computer 35 that the upper-level controller transmits.

Figure 8:
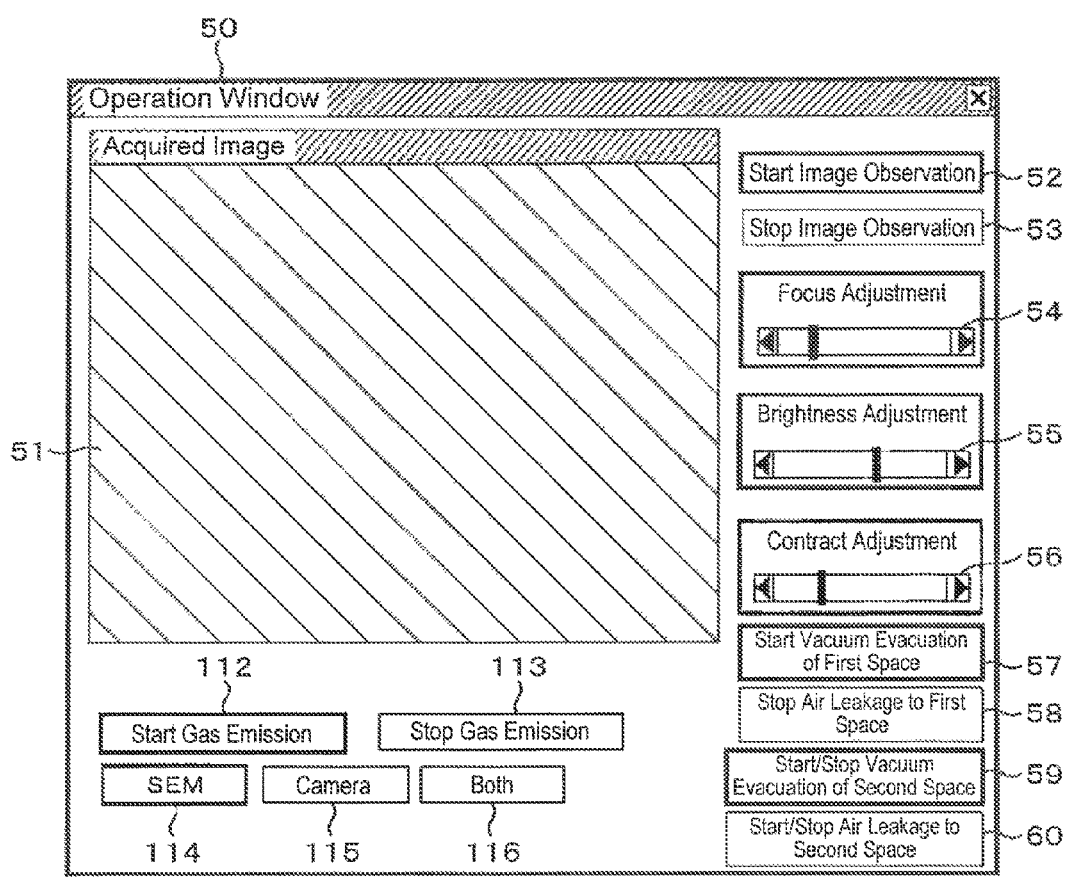
FIG. 8 shows an exemplary configuration of the charged particle microscope in Embodiment 2.

FIG. 8 shows an exemplary operation screen for when a rough evacuation port or a three-way valve is provided on the covering member 122 or on the second housing 121. On the operation screen in this case, vacuum evacuation start/stop buttons for the first space and the second space are separately displayed. When a vacuum evacuation button 59 for the second space is clicked, a vacuum valve provided in the rough evacuation port opens, and vacuum evacuation of the second space starts. When the vacuum evacuation button 59 is clicked again, the vacuum valve in the rough evacuation port closes, and the vacuum evacuation stops. Likewise, when an air leak button 60 for the second space is clicked, a leak valve provided on the three-way valve opens, and the second space is exposed to the atmosphere. When the air leak button 60 is clicked again, the leak valve closes, and the exposure of the second space to the atmosphere stops.

In addition to the aforementioned configuration, it is also possible to provide a contact monitor for monitoring the state of contact between the second housing 121 and the covering member 122 to monitor if the second space is closed or open.

Further, in addition to the secondary electron detector and the reflected electron detector, it is also possible to provide an X-ray detector and a photodetector to conduct EDS analysis and fluorescence line detection. The X-ray detector and the photodetector may be arranged in either the first space 11 or the second space 12.

When the sample 6 is irradiated with an electron beam, an absorption current flows through the sample. Therefore, an ammeter may be provided to measure a current that flows through the sample 6 or the sample table. Accordingly, an image of the absorption current (or an image that uses the absorption current) can be acquired. Alternatively, a transmission electron detector may be arranged below the sample table to acquire a scanning transmission (STEM) image. The sample table may also be used as a detector.

Further, a high voltage may be applied to the sample stage 5. When a high voltage is applied to the sample 6, electrons emitted from the sample 6 can have high energy, which in turn can increase the amount of signals. Thus, image S/N improves.

Further, the configuration of this embodiment can also be applied to a small electron beam lithography system. In that case, the detector 3 is not necessarily required.

As described above, this embodiment can implement not only the effect of Embodiment 1, but also an atmospheric-pressure SEM that can also be used as a high vacuum SEM. In addition, as observation can be executed with a replacement gas being introduced, the scanning electron microscope in this embodiment can acquire an image with higher S/N than the charged particle microscope in Embodiment 1.

Although this embodiment has illustrated an exemplary configuration intended for a tabletop electron microscope, this embodiment can also be applied to a large scanning electron microscope. In the case of a tabletop electron microscope, the whole apparatus or the charged particle optical column is supported on the apparatus installation plane by a housing, while in the case of a large scanning electron microscope, the whole apparatus may be disposed on a mount. Thus, if the first housing 7 is disposed on a mount, the configuration described in this embodiment can be applied as it is to a large scanning electron microscope.

Embodiment 3

Figure 9:
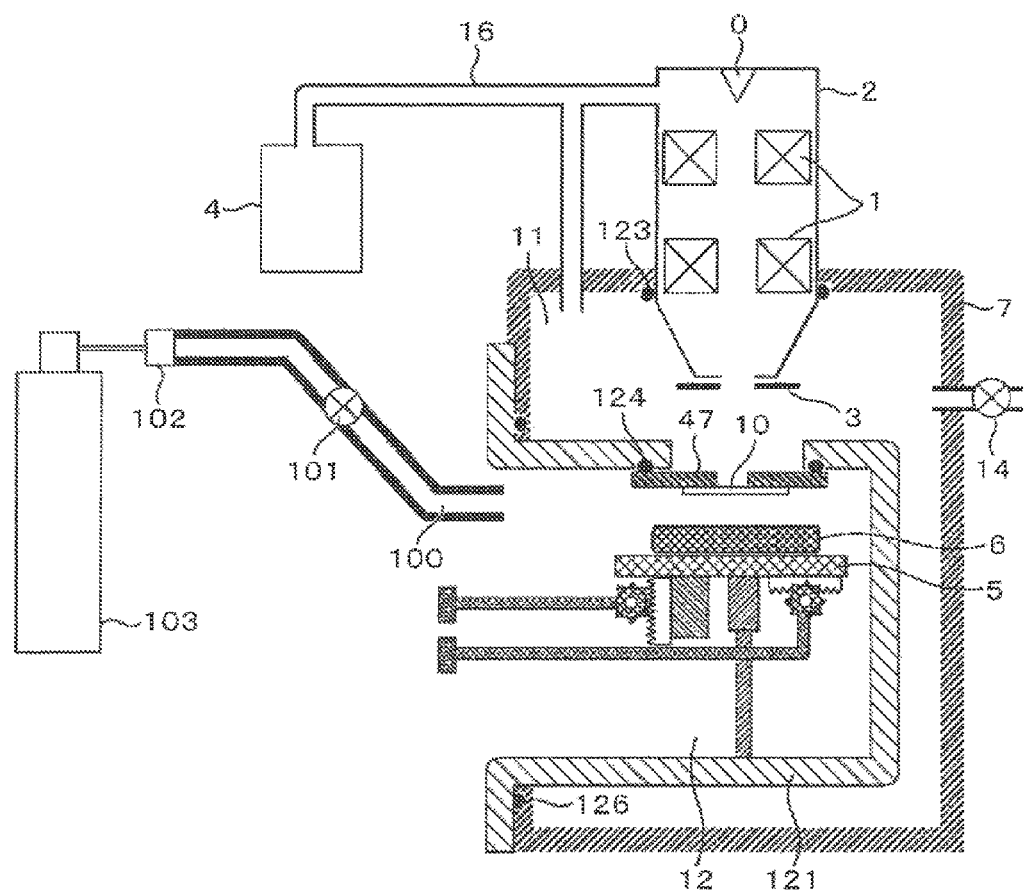
FIG. 9 is an overall configuration view of a charged particle microscope in Embodiment 3.

This embodiment will describe an exemplary configuration in which the covering member 122 is removed from the apparatus configuration of FIG. 2. FIG. 9 shows the overall configuration of the charged particle microscope in this embodiment. The controller is similar to that in Embodiment 2. Thus, illustration of the controller is omitted and only a primary part of the apparatus is shown.

In the configuration shown in FIG. 9, the sample stage 5 is directly fixed to the bottom face of the second housing 121. The gas supply pipe 100 may be either fixed or not to the second housing 121. According to such a configuration, the sample may be placed beyond the edge of the apparatus. Thus, observation of a sample with a larger size than that of Embodiment 2 in which the covering member 122 is provided is possible.

Embodiment 4

Figure 10:
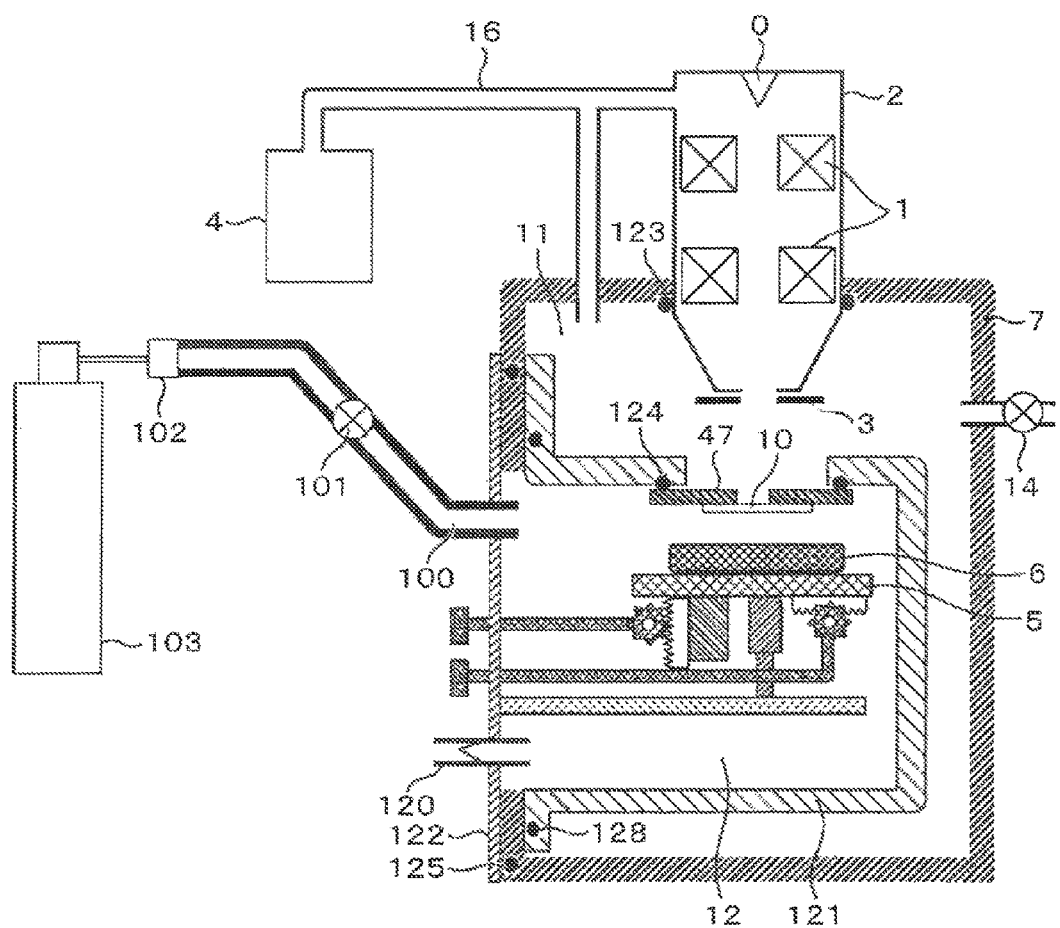
FIG. 10 is an overall configuration view of a charged particle microscope in Embodiment 4.

This embodiment will describe a variation in which the positional relationship between the second housing 121 and the covering member 122 is changed from the apparatus configuration of FIG. 2. FIG. 10 shows the overall configuration of the charged particle microscope in this embodiment. As in Embodiment 3, FIG. 10 shows only a primary part of the apparatus. In this configuration, a vacuum sealing member 128 for vacuum-sealing the first space 11 and the second space 12 is necessary. In this configuration, the mating portion 132 of the second housing is located inside the apparatus. Thus, the size of the whole apparatus can be reduced than those of Embodiments 1-3.

Example 5

Figure 11:
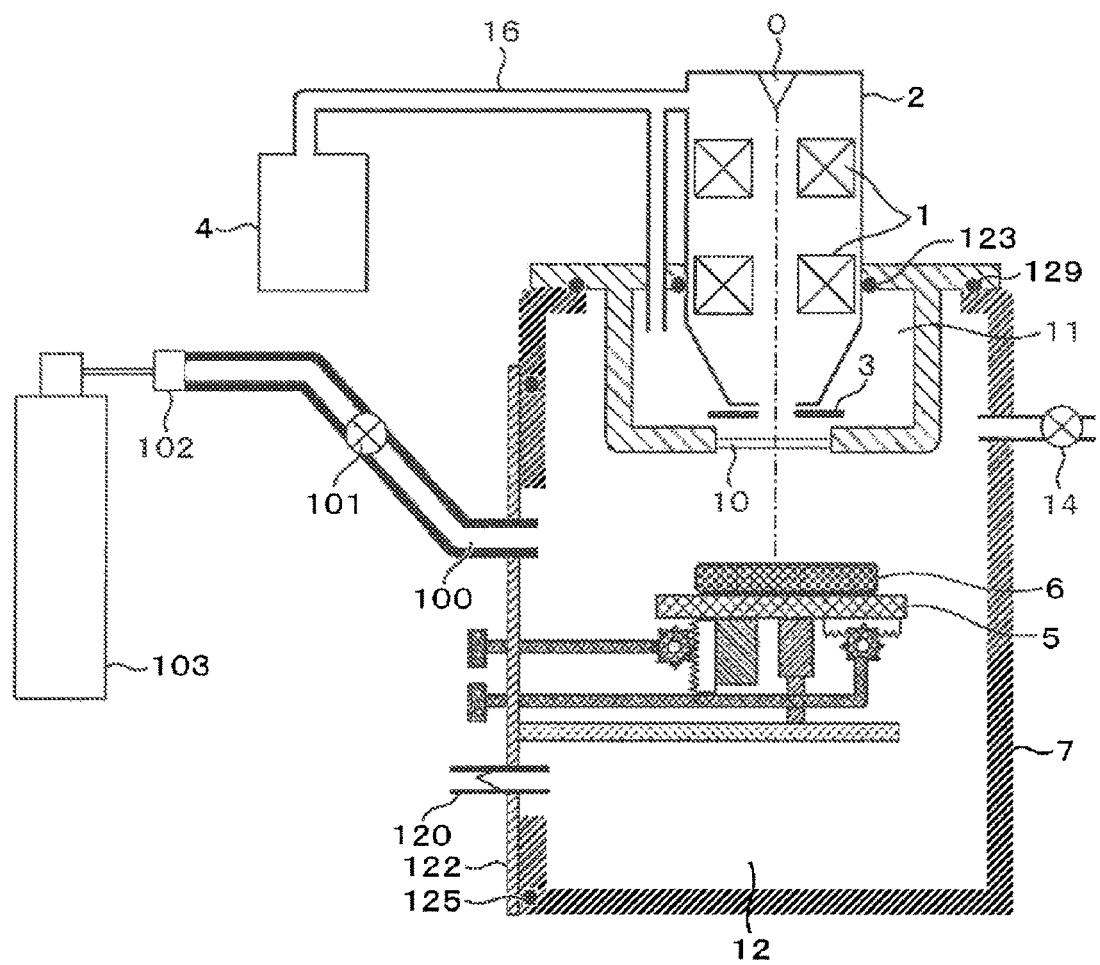
FIG. 11 is an overall configuration view of a charged particle microscope in Embodiment 5.

This embodiment will describe a variation in which the second housing 121 is vacuum-sealed on the upper side of the first housing in the apparatus configuration of FIG. 2. FIG. 11 shows the overall configuration of the charged particle microscope in this embodiment. As in Embodiment 4, FIG. 11 shows only a primary part of the apparatus. In this configuration, using a pot-shaped attachment (i.e., the second housing 121), the attachment is embedded from above the first housing 7, and further, an electron optical column 2 is embedded from above the attachment. The second housing 121 is vacuum-sealed to the electron optical column 2 by the vacuum sealing member 123, and further, the second housing 121 is vacuum-sealed to the first housing 7 by a vacuum sealing member 129. Such a configuration can increase the volume of the second space 12 from that in FIG. 2, and thus allows for the arrangement of a larger sample than that in Embodiment 2.

REFERENCE SIGNS LIST

0 Electron source (charged particle source)
1 Optical lens
2 Electron optical (charged particle optical) column
3 Detector
4 Vacuum pump
5 Sample stage
6 Sample
7 First housing
10 Thin film
11 First space
12 Second space
14 Leak valve
16 Vacuum pipe
18 Column
19 Plate-member support member
20 Bottom plate
35 Personal computer
36 Upper-level controller
37 Lower-level controller
43,44 Communication line
47 Thin film holding member
50 Operation window
51 Image display portion
52 Image observation start button
53 Image observation stop button
54 Focus adjustment button
55 Brightness adjustment button
56 Contrast adjustment button
57,59 Vacuum-evacuation button
58,60 Air leak button
100 Gas supply pipe
101 Gas control valve
102 Connecting portion
103 Gas cylinder
104 Pressure control valve
105 Restriction member
106 Camera
107 Support plate
108,109 Operation knob
112 Gas emission start button
113 Gas emission stop button
114 SEM image display button
115 Camera button
116 SEM/Camera display button
117 Gas emission time setting screen
118 Child window
119 Gas emission execution check box
120 OK button
121 Second housing
122,130 Covering member
123,124,125,126,128,129 Vacuum sealing member
131 Main body portion
132 Mating portion

The invention claimed is:

1. A charged particle beam apparatus comprising:
a charged particle optical column that scans a sample with a primary charged particle beam;
a detector that detects reflected electrons or secondary electrons obtained by the scanning;
a vacuum pump;
a first housing in which the charged particle optical column is supported with respect to an apparatus installation plane; and
a second housing comprising a main body portion that is inserted into the first housing, and a mating portion that is fixed to an outer wall face of the first housing, with a vacuum sealing member interposed therebetween, wherein
the second housing is capable of maintaining a differential pressure between a vacuum and atmospheric pressure in and out of the second housing, and
the second housing has a structure that allows the primary charged particle beam to penetrate or pass therethrough.

2. The charged particle beam apparatus according to claim 1, wherein
the sample is stored in the first housing,
an interior of the second housing is evacuated to a vacuum by the vacuum pump, and
a pressure in the first housing can be maintained higher than a pressure in the second housing.

3. The charged particle beam apparatus according to claim 2, wherein
the first housing has an open face that allows the sample stored in an interior of the first housing to be replaced while the interior of the second housing is maintained in a vacuum state.

4. The charged particle beam apparatus according to claim 3, wherein
the second housing is attached to an outer wall of an upper surface of the first housing.

5. The charged particle beam apparatus according to claim 4, wherein
the second housing comprises a thin film that allows the primary charged particle beam to penetrate therethrough.

6. The charged particle beam apparatus according to claim 5, wherein
the thin film is removably fixed to the second housing with a thin film holding member for holding the thin film interposed therebetween, and
interiors of the first housing and the second housing can be evacuated to a vacuum by removing the thin film holding member from the second housing.

7. The charged particle beam apparatus according to claim 6, wherein
the thin film holding member has a restriction member that restricts a distance between the sample and the thin film to prevent the sample from being located too close to the thin film.

8. The charged particle beam apparatus according to claim 5, further comprising an observation device configured to observe a gap between the thin film and the sample.

9. The charged particle beam apparatus according to claim 5, further comprising a gas introducing portion that introduces a replacement gas for replacing an atmosphere in the first housing.

10. The charged particle beam apparatus according to claim 9, wherein the replacement gas is a light-element gas including a helium gas.

11. The charged particle beam apparatus according to claim 5, further comprising a pressure control valve for controlling a pressure in the first housing,
   wherein, when the pressure in the first housing becomes higher than a predetermined value, the pressure control valve opens to reduce the pressure in the first housing.

12. The charged particle beam apparatus according to claim 5, wherein
   the first housing is cuboid in shape, at least one part of one side face of which is open, and
   the charged particle beam apparatus further comprises a covering member that covers the open face of the cuboid.

13. The charged particle beam apparatus according to claim 12, further comprising
   a gas introducing portion that introduces a replacement gas for replacing an atmosphere in the first housing; and
   a pressure control valve for controlling a pressure in the first housing, wherein
   the gas introducing portion and the pressure control valve are attached to the covering member, and
   a position of attachment of the gas introducing portion to the covering member is higher than a position of attachment of the pressure control valve to the covering member.

14. The charged particle beam apparatus according to claim 12, further comprising
   a gas introducing portion that introduces a replacement gas for replacing an atmosphere in the first housing, wherein
   the covering member has an opening part,
   the gas introducing portion is attached to the covering member, and
   a position of attachment of the gas introducing portion to the covering member is higher than a position of the opening part at the covering member.

15. The charged particle beam apparatus according to claim 12, further comprising a sample stage that is fixed to the covering member and that moves the sample in a plane direction or a height direction.

16. The charged particle beam apparatus according to claim 5, further comprising
   a detector for detecting one or more of ions, electrons, photons, or X-rays that are emitted as a result of scanning of the sample with the charged particle beam, the detector being arranged in the first housing or the second housing, or
   a detector that detects transmission electrons obtained as a result of irradiation of the sample with the charged particle beam, the detector being arranged in the first housing or the second housing.

17. The charged particle beam apparatus according to claim 1, wherein
   the sample is stored in the second housing,
   an interior of a space enclosed by the first housing and the second housing is evacuated to a vacuum by the vacuum pump, and
   a pressure in a space in which the sample is stored can be maintained higher than a pressure in the space enclosed by the first housing and the second housing.

18. The charged particle beam apparatus according to claim 17, wherein the second housing has an open face that allows the sample stored in an interior of the second housing to be replaced while the interior of the first housing is maintained in a vacuum state.

19. The charged particle beam apparatus according to claim 18, wherein the second housing is attached to an outer wall of a side face of the first housing.

20. The charged particle beam apparatus according to claim 19, wherein the second housing comprises a thin film that allows the primary charged particle beam to penetrate therethrough.

* * * * *